(12) United States Patent
Arsovski et al.

(10) Patent No.: US 9,281,023 B2
(45) Date of Patent: Mar. 8, 2016

(54) SINGLE ENDED SENSING CIRCUITS FOR SIGNAL LINES

(71) Applicant: International Business Machines Corporation, Armonk, NY (US)

(72) Inventors: Igor Arsovski, Williston, VT (US); Travis R. Hebig, Rochester, MN (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 275 days.

(21) Appl. No.: 14/146,793

(22) Filed: Jan. 3, 2014

(65) Prior Publication Data
US 2015/0194194 A1 Jul. 9, 2015

(51) Int. Cl.
G11C 7/08 (2006.01)
G11C 7/12 (2006.01)
G11C 7/06 (2006.01)
G11C 15/04 (2006.01)

(52) U.S. Cl.
CPC ...... *G11C 7/08* (2013.01); *G11C 7/067* (2013.01); *G11C 7/12* (2013.01); *G11C 15/04* (2013.01); *G11C 2207/002* (2013.01)

(58) Field of Classification Search
USPC .................................. 365/49.1, 203, 189, 2
See application file for complete search history.

(56) References Cited

U.S. PATENT DOCUMENTS

| | | | |
|---|---|---|---|
| 5,661,417 A | 8/1997 | Kondoh | |
| 6,198,681 B1 | 3/2001 | Forbes | |
| 6,628,143 B2 | 9/2003 | Hsu et al. | |
| 6,999,331 B2 * | 2/2006 | Huang | G11C 15/04 365/207 |
| 7,474,546 B2 * | 1/2009 | Shastry | G11C 15/04 365/203 |
| 7,539,068 B2 | 5/2009 | Wang et al. | |
| 7,590,019 B2 | 9/2009 | Tomishima | |
| 7,724,559 B2 | 5/2010 | Arsovski | |
| 7,751,218 B2 | 7/2010 | Arsovski | |
| 8,472,271 B2 | 6/2013 | Dawson et al. | |
| 8,687,398 B2 * | 4/2014 | Chang | G11C 15/00 365/49.15 |
| 2013/0010559 A1 | 1/2013 | Huang | |
| 2013/0070549 A1 | 3/2013 | Ghosh et al. | |
| 2013/0114361 A1 | 5/2013 | Barth, Jr. et al. | |

OTHER PUBLICATIONS

Arsovski, et al., "Self-referenced sense amplifier for across-chip-variation immune sensing in high-performance Content-Addressable Memories," Custom Integrated Circuits Conference, Sep. 10-13, 2006, pp. 453-456.

Ali, et al, "A High-Speed and Low-Energy Ternary Content Addressable Memory Design Using Feedback in Match Line Sense Amplifier," World Academy of Science, Engineering and Technology 51, 2011, pp. 1355-1363.

Arsovski, et al., U.S. Appl. No. 13/656,829, filed Oct. 22, 2012.

* cited by examiner

*Primary Examiner* — Huan Hoang
*Assistant Examiner* — Minh Dinh
(74) *Attorney, Agent, or Firm* — Gibb & Riley, LLC; David A. Cain, Esq.

(57) ABSTRACT

Disclosed are single-ended sensing circuits. Each of the sensing circuits comprises at least a sense amplifier connected to a sense node, an isolation field effect transistor (FET) connected in series between the sense node and a signal line node, and a pre-charged device connected to the sense node. In order to achieve a relatively fast pre-charge of both the sense and signal line nodes and to also achieve a relatively fast and accurate sense of the sense node, the single-ended circuits further incorporate a variable reference voltage generator connected to the gate of the isolation FET for selectively applying different reference voltages to the gate during pre-charging and sensing operations, respectively, and/or a second pre-charge device connected to the signal line node for facilitating pre-charging of that signal line node.

20 Claims, 12 Drawing Sheets

SINGLE ENDED SENSING CIRCUITS FOR SIGNAL LINES

BACKGROUND

The present disclosure relates to signal line sensing and, more particularly, to single-ended sensing circuits configured for relatively fast pre-charging operations and relatively fast and accurate sensing operations.

Memory circuits, such as content addressable memory (CAM) circuits, dynamic random access memory (DRAM) circuits, static random access memory (SRAM) circuits, etc., often incorporate single-ended sensing circuits to sense the value of a signal and, particularly, a small signal on a signal line (e.g., a match line in the case of a CAM circuit, a bit line in the case of a DRAM circuit, a bit line in the case of an SRAM circuit, etc.). Those skilled in the art will recognize that the term "single-ended" refers to the fact that the sensing circuits sense the value of a signal on a single signal line input into a sense amplifier as opposed to comparing the values of signals on two separate signal lines input into a sense amplifier. Recently, technology scaling (e.g., to sub-100 nm dimensions) has resulted in relatively large random variations in manufactured semiconductor devices incorporated into such memory circuits and, particularly, has resulted in relatively large random threshold voltage (Vt) variations in manufactured field effect transistors (FETs) incorporated into such memory circuits. To compensate for these variations, sensing circuits typically operate with pessimistic timing margins, which degrade performance. Therefore, there is a need in the art for an improved single-ended sensing circuit that compensates for semiconductor device variations and, particularly, FET threshold voltage (Vt) variations with minimal performance degradation.

SUMMARY

In view of the foregoing, disclosed herein are single-ended sensing circuits configured for relatively fast pre-charging operations and for relatively fast and accurate sensing operations in order to improve performance. Each of the sensing circuits comprises at least a sense amplifier connected to a first node (i.e., a sense node), an isolation field effect transistor (FET) connected in series between the sense node and a second node (i.e., a signal line node on a signal line), and a pre-charged device connected to the sense node. In order to achieve a relatively fast pre-charge of both the sense and signal line nodes and to also achieve a relatively fast and accurate sense of the sense node, the single-ended circuits further incorporate a variable reference voltage generator connected to the gate of the isolation FET for selectively applying different reference voltages to the gate during pre-charging and sensing operations, respectively, and/or a second pre-charge device connected to the signal line node for facilitating pre-charging of that signal line node.

More particularly, disclosed herein is a sensing circuit. This sensing circuit can comprise at least a first node (i.e., a sense node), a second node (i.e., a signal line node), an isolation field effect transistor having a first threshold voltage, a variable reference voltage generator, a pre-charge device and a sense amplifier having a second threshold voltage. The second node can be electrically connected to a signal line. The isolation field effect transistor can comprise a source, which is also electrically connected to the second node, a drain, which is electrically connected to the first node, and a gate, which is electrically connected to the variable reference voltage generator. The pre-charge device can be electrically connected to the first node. Finally, the sense amplifier can comprise an input, which receives an input signal from the first node, and an output, which outputs an output signal.

During a pre-charging mode, the variable reference voltage generator can apply a first reference voltage to the gate of the isolation field effect transistor and the pre-charge device can be turned on (e.g., by a global pre-charge enable signal). As a result, the first node can be pre-charged to a first pre-charge voltage (e.g., Vdd), the second node can be pre-charged to a second pre-charge voltage that is lower than the first pre-charge voltage, the input signal from the first node at the input to the sense amplifier can become a HIGH input signal and the output signal at the output of the sense amplifier can become a LOW output signal. It should be noted that the rate at which the second node is pre-charged will decrease as the actual voltage on the second node approaches an amount equal to the first reference voltage minus the first threshold voltage of the isolation field effect transistor. Thus, the higher first reference voltage, the faster the desired second pre-charge voltage can be reached. In other words, a relatively high first reference voltage can be used so that a relatively fast pre-charge of the second node can be achieved and, particularly, so that the second node can be pre-charged to the desired second pre-charge voltage within a desired amount of time.

During a sensing mode, the variable reference voltage generator can apply a second reference voltage that is less than the first reference voltage to the gate of the isolation field effect transistor. In this case, if no voltage decrease is sensed at the first node, the output signal at the output of the sense amplifier will remain a LOW output signal. However, upon sensing a voltage decrease at the first node, the sense amplifier can switch the LOW output signal to a HIGH output signal. It should be noted that the second reference voltage can be pre-selected so that a relatively fast and accurate sensing of the first node can be achieved. For example, the second reference voltage can be pre-selected such that, as mentioned above, it is less than the first reference voltage and further such that the second threshold voltage of the sense amplifier is greater than the second reference voltage minus the first threshold voltage of the isolation field effect transistor. Thus, a voltage decrease at the first node to an actual voltage that is below the second threshold voltage of the sense amplifier will occur relatively quickly following a corresponding voltage decrease at the second node, thereby causing the sense amplifier to switch the output signal at the output from the LOW output signal to a HIGH output signal within a desired amount of time.

Also disclosed herein is another sensing circuit. This sensing circuit can comprise at least a first node (i.e., a sense node), a second node (i.e., a signal line node), an isolation field effect transistor having a first threshold voltage, a reference voltage generator, a first pre-charge device, a second pre-charge device and a sense amplifier having a second threshold voltage.

The second node can be electrically connected to a signal line. The isolation field effect transistor can comprise a source, which is also electrically connected to the second node, a drain, which is electrically connected to the first node, and a gate, which is electrically connected to the reference voltage generator. The first pre-charge device can be electrically connected to the first node. The second pre-charge device can be electrically connected to the second node. Finally, the sense amplifier can comprise an input, which receives an input signal from the first node, and an output, which outputs an output signal and is further electrically connected to the second pre-charge device.

During a pre-charging mode, the reference voltage generator can apply a reference voltage to the gate of the isolation field effect transistor and the first and second pre-charge devices can be turned on (e.g., by a global pre-charge enable signal). As a result, the first node can be pre-charged to a first pre-charge voltage (e.g., Vdd), the second node can be pre-charged to a second pre-charge voltage that is lower than the first pre-charge voltage, the input signal from the first node to the input of the sense amplifier can become a HIGH input signal and the output signal at the output of the sense amplifier can become a LOW output signal.

It should be noted that, during this pre-charging mode, the isolation field effect transistor will initially be turned on because the voltage on the gate (Vg) of the isolation field effect transistor minus the voltage on the source (VS) of the isolation field effect transistor (which is initially reset to zero) (i.e., Vgs) will be greater than the first threshold voltage of that isolation field effect transistor. Thus, the first node and second node will pre-charge at the same relatively fast rate. However, when the voltage on the second node reaches a value that results in Vgs being equal to or below the first threshold voltage, the isolation field effect transistor will turn off. When the isolation field effect transistor turns off, the first node will continue pre-charging to first pre-charged voltage (e.g., Vdd) at an even faster rate because the first and second nodes are isolated from each other. As mentioned above, once the first node is pre-charged to the first pre-charge voltage, the output of the sense amplifier will switch to a LOW output signal. This LOW output signal can cause the second pre-charge device to automatically turn off (i.e., to cause the second pre-charge device to stop pre-charging the second node). Thus, a second pre-charge device on the second node can be used so that a relatively fast pre-charge of the second node can be achieved and, particularly, so that the second node can be pre-charged to the desired second pre-charge voltage within a desired amount of time.

During a sensing mode, the reference voltage generator can similarly apply the reference voltage to the gate of the isolation field effect transistor. Again, if no voltage decrease is sensed at the first node, the output signal at the output of the sense amplifier will remain a LOW output signal. However, upon sensing a voltage decrease at the first node, the sense amplifier can switch the LOW output signal to a HIGH output signal. It should be noted that the reference voltage can be pre-selected so that a relatively fast and accurate sensing of the first node can be achieved. For example, the reference voltage can be pre-selected such that the second threshold voltage of the sense amplifier is greater than the reference voltage minus the first threshold voltage of the isolation field effect transistor. Thus, a voltage decrease at the first node to an actual voltage that is below the second threshold voltage of the sense amplifier will occur relatively quickly following a corresponding voltage decrease at the second node, thereby causing the sense amplifier to switch the output signal at the output from the LOW output signal to a HIGH output signal within a desired amount of time.

Also disclosed herein is another sensing circuit that combines the features of the two different sensing circuits described above. Specifically, this sensing circuit can comprise at least a first node (i.e., a sense node), a second node (i.e., a signal line node), an isolation field effect transistor having a first threshold voltage, a variable reference voltage generator, a first pre-charge device, a second pre-charge device and a sense amplifier having a second threshold voltage. The second node can be electrically connected to a signal line. The isolation field effect transistor can comprise a source, which is also electrically connected to the second node, a drain, which is electrically connected to the first node, and a gate, which is electrically connected to the variable reference voltage generator. The first pre-charge device can be electrically connected to the first node. The second pre-charge device can be electrically connected to the second node. Finally, the sense amplifier can comprise an input, which receives an input signal from the first node, and an output, which outputs an output signal and is further electrically connected to the second pre-charge device.

During a pre-charging mode, the variable reference voltage generator can apply a first reference voltage to the gate of the isolation field effect transistor and the first and second pre-charge devices can be turned on (e.g., by a global pre-charge enable signal). As a result, the first node can be pre-charged to a first pre-charge voltage (e.g., Vdd), the second node can be pre-charged to a second pre-charge voltage that is lower than the first pre-charge voltage, the input signal from the first node to the input of the sense amplifier can become a HIGH input signal and the output signal at the output of the sense amplifier can become a LOW output signal.

It should be noted that, during this pre-charging mode, the isolation field effect transistor will initially be turned on because the voltage on the gate (Vg) of the isolation field effect transistor minus the voltage on the source (VS) of the isolation field effect transistor (which is initially reset to zero) (i.e., Vgs) will be greater than the first threshold voltage of that isolation field effect transistor. Thus, the first node and second node will initially pre-charge at the same relatively fast rate. However, when the voltage on the source reaches a value that results in Vgs being equal to or below the first threshold voltage, the isolation field effect transistor will turn off. When the isolation field effect transistor turns off, the first node will continue pre-charging to the first pre-charged voltage (e.g., Vdd) at an even faster rate because the first and second nodes are isolated from each other. As mentioned above, once the first node is pre-charged to the first pre-charge voltage, the output of the sense amplifier will switch to a LOW output signal. This LOW output signal can cause the second pre-charge device to automatically turn off (i.e., can cause the second pre-charge device to stop pre-charging the second node). Additionally, the rate at which the second node is pre-charged will decrease as the actual voltage on the second node approaches an amount equal to the first reference voltage minus the first threshold voltage of the isolation field effect transistor. Consequently, the higher first reference voltage, the faster the desired second pre-charge voltage can be reached. Thus, a combination of a relatively high first reference voltage and a second pre-charge device on the second node can be used so that a relatively fast pre-charge of the second node can be achieved and, particularly, so that the second node can be pre-charged to the desired second pre-charge voltage within a desired amount of time.

During a sensing mode, the variable reference voltage generator can apply a second reference voltage that is less than the first reference voltage to the gate of the isolation field effect transistor. Again, if no voltage decrease is sensed at the first node, the output signal at the output of the sense amplifier will remain a LOW output signal. However, upon sensing a voltage decrease at the first node, the sense amplifier can switch the LOW output signal to a HIGH output signal. It should be noted that the second reference voltage can be pre-selected so that a relatively fast and accurate sensing of the first node can be achieved. For example, the second reference voltage can be pre-selected such that, as mentioned above, it is less than the first reference voltage and further such that the second threshold voltage of the sense amplifier is greater than the second reference voltage minus the first threshold voltage of the isolation field effect transistor. Thus, a voltage decrease at the first node to an actual voltage that is below the second threshold voltage of the sense amplifier will occur relatively quickly following a corresponding voltage decrease at the second node, thereby causing the sense amplifier to switch the output signal at the output from the LOW output signal to a HIGH output signal within a desired amount of time.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, memory circuits, such as content addressable memory (CAM) circuits, dynamic random access memory (DRAM) circuits, static random access memory (SRAM) circuits, etc., often incorporate single-ended sensing circuits to sense the value of a signal and, particularly, a small signal on a signal line (e.g., a match line in the case of a CAM circuit, a bit line in the case of a DRAM circuit, a bit line in the case of an SRAM circuit, etc.). Those skilled in the art will recognize that the term "single-ended" refers to the fact that the sensing circuits sense the value of a signal on a single signal line input into a sense amplifier as opposed to comparing the values of signals on two separate signal lines input into a sense amplifier. Recently, technology scaling (e.g., to sub-100 nm dimensions) has resulted in relatively large random variations in manufactured semiconductor devices incorporated into such memory circuits and, particularly, has resulted in relatively large random threshold voltage (Vt) variations in manufactured field effect transistors (FETs) incorporated into such memory circuits. To compensate for these variations, sensing circuits typically operate with pessimistic timing margins, which degrade performance.

Figure 1:
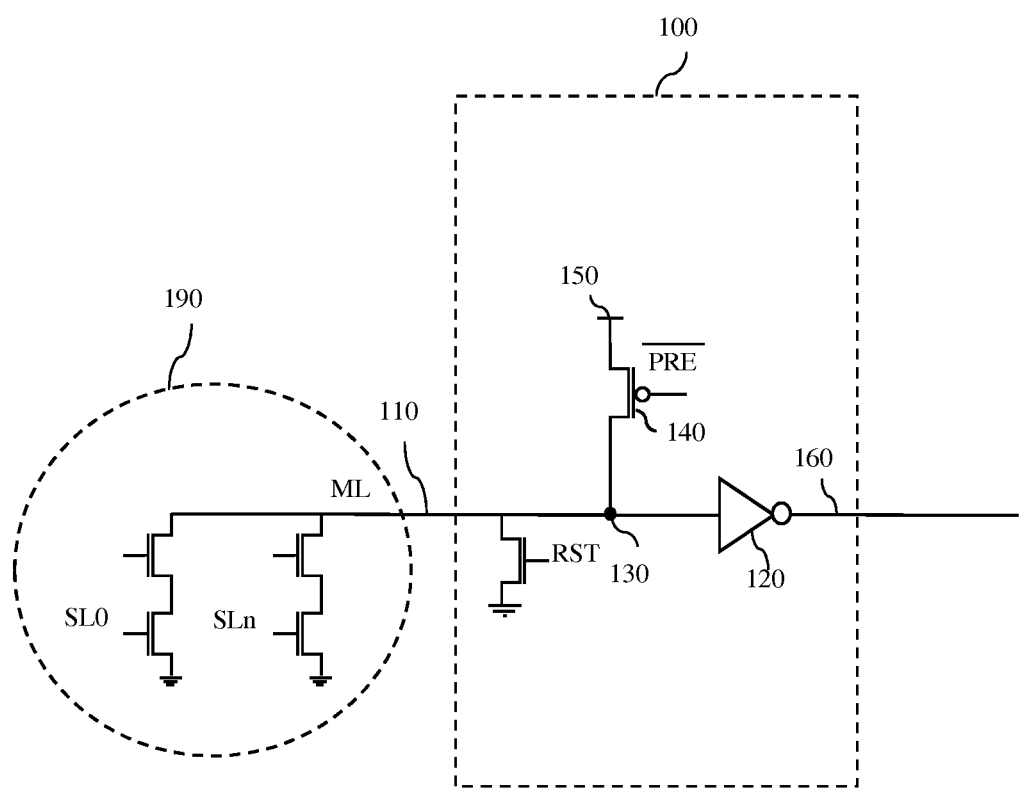
FIG. 1 is a schematic diagram illustrating an exemplary single-ended sensing circuit.

For example, FIG. 1 is a schematic diagram illustrating an exemplary single-ended sensing circuit 100 that is configured to sense a value on a signal line 110. For purposes of illustration, the signal line 110 is shown as a match line connected to comparison logic 190 of a CAM circuit. It should be understood that, alternatively, this signal line 110 could comprise a bit line of a dynamic random access memory (DRAM) circuit, a bit line of a static random access memory (SRAM) circuit, or any other type of signal line, which requires sensing by a sense amplifier. In any case, this sensing circuit 100 can comprise a sense amplifier 120 and, particularly, an inverter, electrically connected to a sense node 130 on the signal line 110. Additionally, this sensing circuit 100 can comprise a p-type field effect transistor (PFET) 140 electrically connected in series between a positive supply voltage 150 (e.g., Vdd) and the sense node 130. In operation, a pre-charge operation is performed by the PFET 140, prior to performance by the sense amplifier 120 of a sensing operation. Specifically, during a pre-charging mode, the PFET 140 can be switched on in order to pre-charge the sense node 130 to the positive supply voltage 150 such that the sense node 130 will have high value (i.e., a "1" value) and the output 160 of the sense amplifier 120 will have a low value (i.e., a "0" value). During the sensing mode, the PFET 140 can be switched off and the comparison logic 190 can be enabled. If the signal line 110 remains at a high value when the comparison logic 190 is enabled, the output 160 of the sense amplifier 120 will remain at a low value. However, if the signal line 110 is pulled to a low value, the output 160 of the sense amplifier 120 will switch to a high value. In such a sensing circuit 100, the pre-charge operation occurs relatively quickly, but requires a significant amount of power. Additionally, due to threshold voltage variations, the time required to pull down the signal line to a low value may vary. Thus, a large latch delay is required to ensure accurate sensing.

In view of the foregoing, disclosed herein are single-ended sensing circuits configured for relatively fast pre-charging operations and for relatively fast and accurate sensing operations in order to improve performance. Each of the sensing circuits comprises at least a sense amplifier connected to a first node (i.e., a sense node), an isolation field effect transistor (FET) connected in series between the sense node and a second node (i.e., a signal line node on a signal line), and a pre-charged device connected to the sense node. In order to achieve a relatively fast pre-charge of both the sense and signal line nodes and to also achieve a relatively fast and accurate sense of the sense node, the single-ended circuits further incorporate a variable reference voltage generator connected to the gate of the isolation FET for selectively applying different reference voltages to the gate during pre-charging and sensing operations, respectively, and/or a second pre-charge device connected to the signal line node for facilitating pre-charging of that signal line node. Specifically, one sensing circuit achieves a fast pre-charge by turning on a pre-charge device connected to the first node and applying a relatively high first reference voltage (Vref1) to the gate of the isolation FET, thereby pre-charging the first node to a first pre-charge voltage (e.g., Vdd) and the second node to a second, lesser, pre-charge voltage. This same sensing circuit achieves a relatively fast sense by applying a second, lesser, reference voltage (Vref2) to the gate of the isolation FET when sensing the voltage on the sense node. Another sensing circuit achieves a relatively fast pre-charge by turning on parallel pre-charge devices connected to the first and second nodes, thereby pre-charging the first node to a first pre-charge voltage (e.g., Vdd) and the second node to a second, lesser, pre-charge voltage. This same sensing circuit achieves a relatively fast sense by applying a relatively low reference voltage (Vref) to the gate of the isolation FET during the sense operation. Yet another sensing circuit combines the features of these two sensing circuits.

Figure 2:
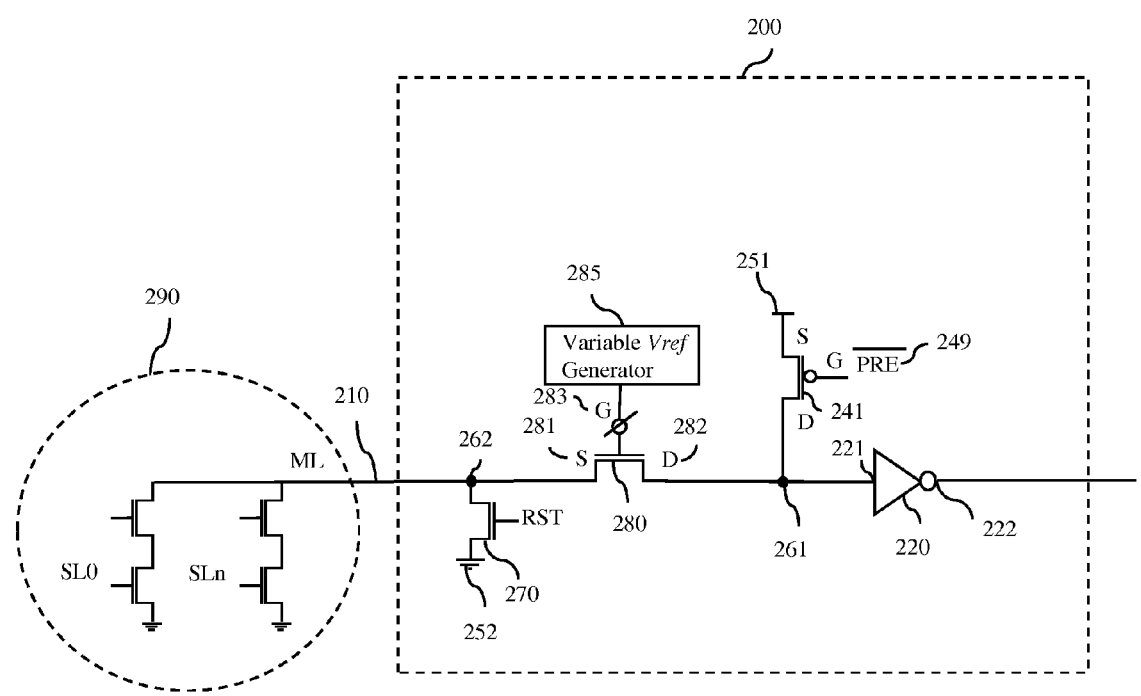
FIG. 2 is a schematic drawing illustrating a single-ended sensing circuit incorporating a variable reference voltage generator.
Figure 3:
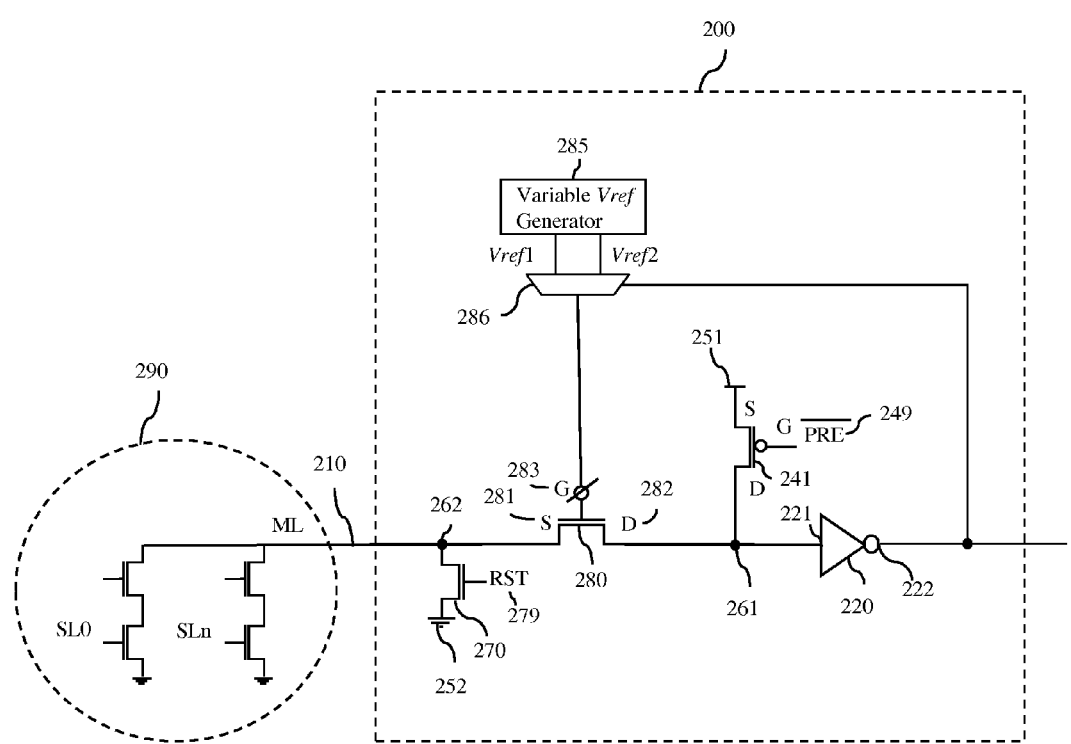
FIG. 3 is a schematic drawing illustrating a single-ended sensing circuit, such as that shown in FIG. 2, further incorporating a multiplexer.

More particularly, FIGS. 2 and 3 are schematic drawings illustrating alternative embodiments of a single-ended sensing circuit 200 configured to sense a signal value and, particularly, a small signal value on a signal line 210. This sensing circuit 200 can comprise at least a first node 261 (i.e., a sense node), a second node 262 (i.e., a signal line node), an isolation field effect transistor (FET) 280 having a first threshold voltage, a variable reference voltage generator 285, a pre-charge device 241, a sense amplifier 220 having a second threshold voltage, and a reset device 270.

Specifically, a signal line 210 can be electrically connected to the second node 262. For purposes of illustration, this signal line 210 is shown as a match line connected to comparison logic 290 of a content addressable memory (CAM) circuit. It should be understood that, alternatively, this signal line 210 could comprise a bit line of a dynamic random access memory (DRAM) circuit, a bit line of a static random access memory (SRAM) circuit, or any other type of signal line, which requires sensing by a sense amplifier.

The isolation FET 280 can comprise, for example, an n-type field effect transistor (NFET) comprising a source 281, a drain 282, and a gate 283. The isolation FET 280 can be electrically connected in series between the second node 262 and the first node 261. That is, the source 281 of the isolation FET 280 can be electrically connected to the second node 262 and drain 282 of the isolation FET 280 can be electrically connected to the first node 261. Additionally, the gate 283 of the isolation FET 280 can be electrically connected to the variable reference voltage generator 285.

The pre-charge device 241 can comprise, for example, a p-type field effect transistor (PFET) comprising a source, a drain and a gate. The pre-charge device 241 can be electrically connected in series between a first power supply 251 (e.g., a positive power supply) and the first node 261. That is, the source of the pre-charge device 241 can be electrically connected to the first power supply 251 and the drain of the pre-charge device 241 can be electrically connected to the first node 261. This pre-charge device 241 can be controlled by a pre-charge enable signal 249 applied to the gate. Such a pre-charge enable signal 249 can be a global pre-charge enable signal applied simultaneously to multiple pre-charge devices on multiple sensing circuits within a given circuit (e.g., within a given memory circuit).

The sense amplifier 220 can comprise an inverting sense amplifier. Specifically, this sense amplifier 220 can comprise an input 221, which receives an input signal from the first node 261, and an output 222, which outputs an output signal that is inverted with respect to the input signal. This inverting sense amplifier 220 can comprise, for example, a source follower sense amplifier (also referred to as a common drain sense amplifier), a Schmitt trigger comparator or any other suitable inverting sense amplifier.

Figure 4:
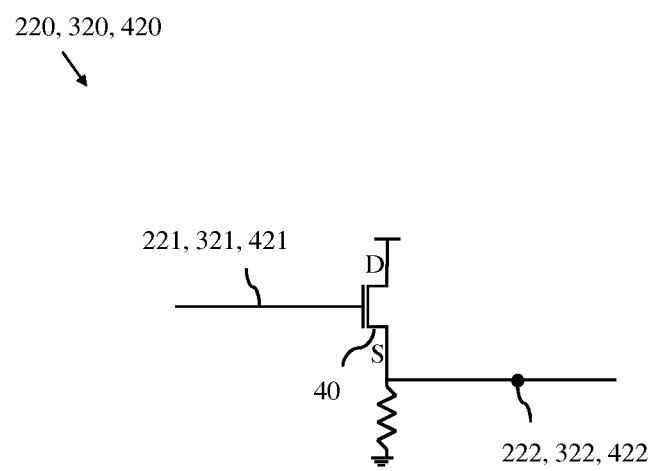
FIG. 4 is a schematic drawing illustrating an exemplary source follower sense amplifier.

FIG. 4 is a schematic drawing of an exemplary source follower sense amplifier that can be incorporated into the sensing circuit 200. This source follower sense amplifier can comprise a single n-type field effect transistor (NFET) 40. The input signal at the input 221 can be applied to the gate of the NFET 40 and the output signal at the output 222 can be captured from the source of the NFET 40.

Figure 5:
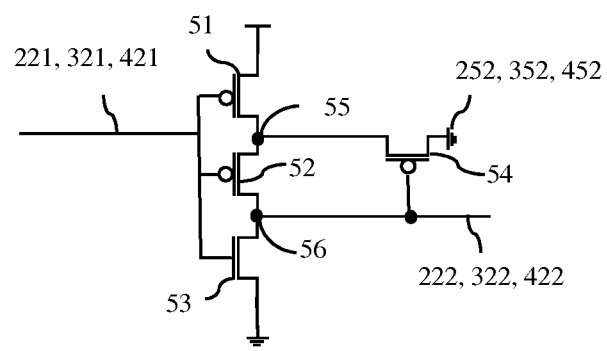
FIG. 5 is a schematic drawing illustrating an exemplary inverting Schmitt trigger comparator.

FIG. 5 is a schematic drawing of an exemplary inverting Schmitt trigger comparator that can be incorporated into the sensing circuit 200. This inverting Schmitt trigger comparator can comprise: a pair of series-connected p-type field effect transistors (PFETs) 51-52, an n-type field effect transistor (NFET) 53 connected in series to the pair of PFETs 51-52 and an additional p-type field effect transistor (PFET) 54 connected in series between a node 55 at the junction between the series-connected pair of PFETs 51-52 and a second power supply 252 (e.g., ground). The input signal at the input 221 can be applied to the gates of the PFETs 51-52 as well as to the gate of the NFET 53, the output signal at the output 222 can be captured from a node 56 at the junction between the PFET 52 and the NFET 53 and can further be applied to the gate of the PFET 54. By configuring the sense amplifier 220 as an inverting Schmitt trigger comparator, hysteresis is introduced for leakage margin and the output signal at the output 222 retains its value until the input signal at the input 221 changes sufficiently to "trigger" a switch.

The variable reference voltage generator 285 can, as mentioned above, be electrically connected to the gate 283 of the isolation FET 280 and can generate and output (i.e., can be adapted to generate and output, can be configured to generate and output, etc.) at least two different reference voltages to that gate 283. Specifically, the variable reference voltage generator 285 can generate a first reference voltage (Vref1) (e.g., Vdd or some lesser voltage amount) and a second reference voltage (Vref2) that is less than the first reference voltage. Multiple different variable reference voltage generators, which could be incorporated into the sensing circuit 200 disclosed herein, are well known in the art (e.g., see U.S. patent Ser. No. 13/656,829 of Arsovski et al., filed on Oct. 22, 2012, assigned to International Business Machines Corporation and incorporated herein by reference in its entirety). Thus, the details of such variable reference voltage generators are omitted from this specification in order to allow the reader to focus on the salient aspects of the disclosed sensing circuit.

In any case, this variable reference voltage generator 285 can be controlled (e.g., by a controller (not shown)) to selectively output either the first reference voltage (Vref1) or the second reference voltage (Vref2), as shown in FIG. 2. Alternatively, the variable reference voltage generator 285 can be electrically connected to the gate 283 of the isolation FET 280 through a multiplexer 286, which is also electrically connected to the output 222 of the sense amplifier 220, as shown in FIG. 3. In this case, the variable reference voltage generator 285 can simultaneously output (i.e., can be adapted to simultaneously output, can be configured to simultaneously output, etc.) both the first reference voltage (Vref1) and the second reference voltage (Vref2) and the multiplexer 286 can selectively apply (i.e., can be adapted to selectively apply, can be configured to selectively apply, etc.) either the first reference voltage (Vref1) or the second reference voltage (Vref2) to the gate of the isolation FET 280 depending upon the value of the output signal at the output 222 of the sense amplifier 220, as discussed in greater detail below.

The reset device 270 can comprise, for example, an n-type field effect transistor (NFET) comprising a source, a drain and a gate. The reset device 270 can be electrically connected in series between the second power supply 252 (e.g., ground) and the second node 262. That is, the source of the reset device 270 can be electrically connected to the second power supply 252 and the drain of the reset device 270 can be electrically connected to the second node 262. This reset device 270 can be controlled by a reset enable signal 279 applied to the gate. Such a reset enable signal can be a global reset enable signal output simultaneously to multiple reset devices on multiple sensing circuits within a given circuit (e.g., within a given memory circuit).

In operation of the sensing circuit 200, during a reset mode, the reset device 270 can be turned on (e.g., by applying a HIGH reset enable signal 279 to its gate), thereby making the reset device conductive and pulling the second node 262 low (i.e., to ground). Following reset, the reset device 270 can be turned off (e.g., by applying a LOW reset enable signal 279 to its gate) and the sensing circuit 200 can enter into a pre-charging mode followed by a sensing mode.

During the pre-charging mode, the variable reference voltage generator 285 can apply a first reference voltage (Vref1) to the gate 283 of the isolation FET 280 and the pre-charge device 241 can be turned on (e.g., by applying a LOW pre-charge enable signal 249 to the gate of the PFET). As a result, the first node 261 can be pre-charged to a first pre-charge voltage and the second node 262 can be pre-charged to a second pre-charge voltage that is lower than the first pre-charge voltage. Furthermore, the input signal from the first node 261 at the input 221 to the sense amplifier 220 can become a HIGH input signal and the output signal at the output 222 of the sense amplifier 220 can become a LOW output signal. The first pre-charge voltage on the first node 261 can comprise, for example, Vdd. That is, the pre-charge device 241 can, for example, pull the first node 261 up to Vdd. The second pre-charge voltage on the second node 262 can be approximately equal to the first reference voltage (Vref1) minus the first threshold voltage of the isolation FET 280. That is, the pre-charge operation can be performed so as to pull the second node 262 up to a second pre-charge voltage that approaches the first reference voltage (Vref1) minus the first threshold voltage of the isolation FET 280. For optimal performance, the sensing circuit 200 can be designed such that this second pre-charge voltage is less than the second threshold voltage of the sense amplifier 220.

It should be noted that the rate at which the second node 262 is pre-charged will decrease as the actual voltage on the second node 262 approaches an amount equal to the first reference voltage (Vref1) minus the first threshold voltage of the isolation FET 280. Thus, the higher first reference voltage (Vref1), the faster the desired second pre-charge voltage can be reached at the second node 262. Consequently, a relatively high first reference voltage (Vref1) can be used so that a relatively fast pre-charge of the second node 262 can be achieved and, particularly, so that the second node 262 can be pre-charged to the desired second pre-charge voltage within a desired amount of time.

During the sensing mode, the variable reference voltage generator 285 can apply the second reference voltage (Vref2), which, as mentioned above, is less than the first reference voltage (Vref2), to the gate 283 of the isolation FET 280. Then, the sense amplifier 220 can sense a voltage decrease at the first node 261 when/if a corresponding voltage decrease occurs at the second node 262 and, particularly, when/if the voltage on the second node 262 decreases from the second pre-charge voltage to below the second reference voltage (Vref2) minus the first threshold voltage of the isolation FET 280. Specifically, if no voltage decrease is sensed at the first node 261, the output signal at the output 222 of the sense amplifier 220 will remain a LOW output signal. However, upon sensing a voltage decrease at the first node 261, the sense amplifier 220 can switch the LOW output signal to a HIGH output signal.

It should be noted that the second reference voltage (Vref2) can be pre-selected so that a relatively fast and accurate sensing of the first node 261 can be achieved. For example, the second reference voltage (Vref2) can be pre-selected such that, as mentioned above, it is less than the first reference voltage (Vref1) and further such that the second threshold voltage of the sense amplifier 220 is greater than the second reference voltage (Vref2) minus the first threshold voltage of the isolation FET 280. Thus, a voltage decrease at the first node 261 to an actual voltage that is below the second threshold voltage of the sense amplifier 220 will occur relatively quickly following a corresponding voltage decrease at the second node 262, thereby causing the sense amplifier 220 to switch the output signal at the output 222 from the LOW output signal to a HIGH output signal within a desired amount of time.

As mentioned above, the variable reference voltage generator 285 can be controlled (e.g., by a controller (not shown)) to selectively output either the first reference voltage (Vref1) or the second reference voltage (Vref2), as shown in FIG. 2. Alternatively, the variable reference voltage generator 285 can be electrically connected to the gate 283 of the isolation FET 280 through a multiplexer 286, which is controlled by the output 222 of the sense amplifier 220, as shown in FIG. 3. In this case, when the input signal from the first node 261 to the input 221 of the sense amplifier 220 is a LOW input signal and the output signal at the output 222 of the sense amplifier 220 is a HIGH output signal, the multiplexer 286 can selectively and automatically apply (i.e., can be adapted to selectively and automatically apply, can be configured to selectively and automatically apply, etc.) the first reference voltage (Vref1) to the gate 283 of the isolation FET 280. Furthermore, once the first node 261 is pre-charged to the first pre-charge voltage and, thus, the input signal to the input 221 of the sense amplifier is a HIGH input signal and the output signal at the output 222 switches to a LOW output signal, the multiplexer 286 can selectively and automatically apply (i.e., can be adapted to selectively and automatically apply, can be configured to selectively and automatically apply, etc.) the second reference voltage (Vref2) to the gate 283 of the isolation FET 280.

The above-described sensing circuit 200 introduces hysteresis by using a relatively high first reference voltage (Vref1) during the pre-charge mode and a relatively low second reference voltage (Vref2) during the sensing mode in order to provide both fast pre-charge and fast sense, respectively.

Figure 6:
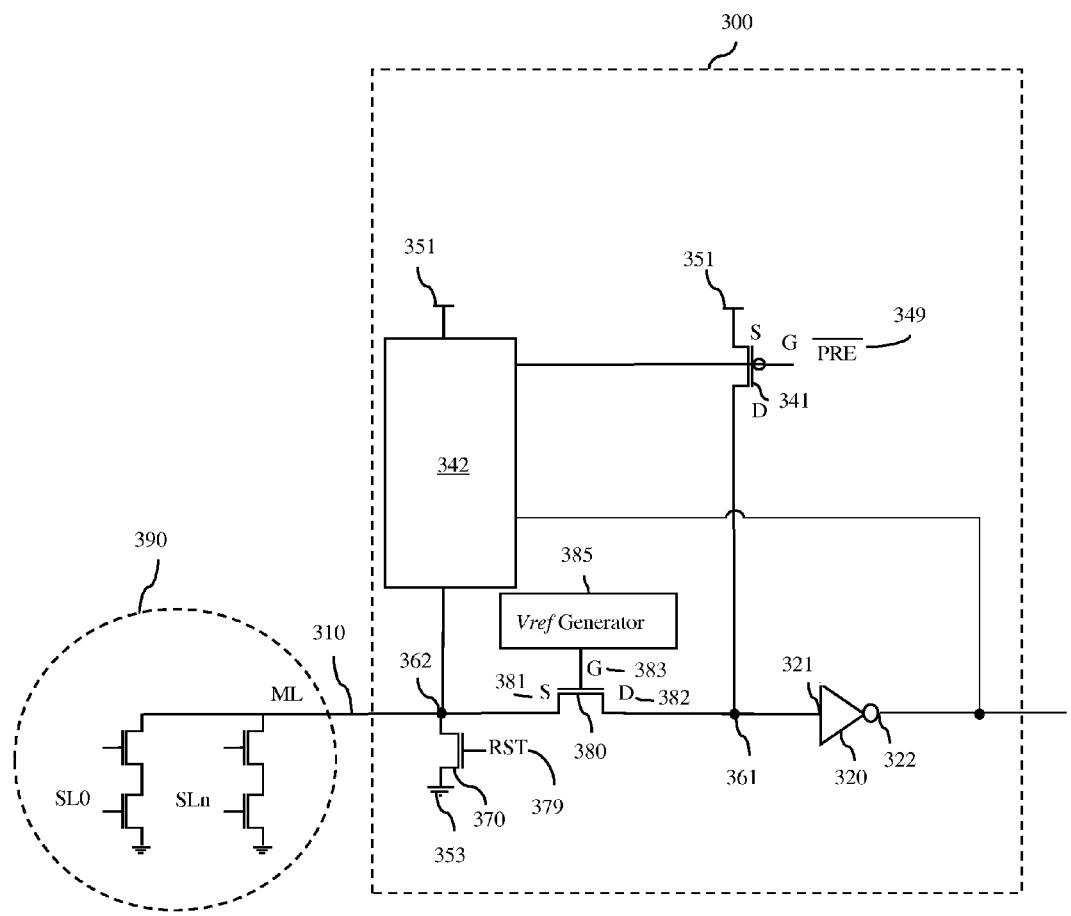
FIG. 6 is a schematic drawing illustrating a single-ended sensing circuit incorporating a first pre-charge device and a second pre-charge device.

FIG. 6 is a schematic drawing illustrating another single-ended sensing circuit 300 configured to sense a signal value and, particularly, a small signal value on a signal line 310. This sensing circuit 300 can comprise at least a first node 361 (i.e., a sense node), a second node 362 (i.e., a signal line node), an isolation field effect transistor (FET) 380 having a first threshold voltage, a reference voltage generator 385, a first pre-charge device 341, a second pre-charge device 342, a sense amplifier 320 having a second threshold voltage, and at least one reset device.

Specifically, a signal line 310 can be electrically connected to the second node 362. For purposes of illustration, this signal line 310 is shown as a match line connected to comparison logic 390 of a content addressable memory (CAM) circuit. It should be understood that, alternatively, this signal line 310 could comprise a bit line of a dynamic random access memory (DRAM) circuit, a bit line of a static random access memory (SRAM) circuit, or any other type of signal line, which requires sensing by a sense amplifier.

The isolation FET 380 can comprise, for example, an n-type field effect transistor (NFET) comprising a source 381, a drain 382, and a gate 383. The isolation FET 380 can be electrically connected in series between the second node 362 and the first node 361. That is, the source 381 of the isolation FET 380 can be electrically connected to the second node 362 and drain 382 of the isolation FET 380 can be electrically connected to the first node 361. Additionally, the gate 383 of the isolation FET 380 can be electrically connected to the reference voltage generator 385.

The first pre-charge device 341 can comprise, for example, a p-type field effect transistor (PFET) comprising a source, a drain and a gate. The first pre-charge device 341 can be electrically connected in series between a first power supply 351 (e.g., a positive power supply) and the first node 361. That is, the source of the pre-charge device 341 can be electrically connected to the first power supply 351 and the drain of the pre-charge device 341 can be electrically connected to the first node 361. This first pre-charge device 341 can be controlled by a pre-charge enable signal 349 applied to the gate. Such a pre-charge enable signal can be a global pre-charge enable signal applied simultaneously to multiple pre-charge devices on multiple sensing circuits within a given circuit (e.g., within a given memory circuit).

The sense amplifier 320 can comprise an inverting sense amplifier. Specifically, this sense amplifier 320 can comprise an input 321, which receives an input signal from the first node 361, and an output 322, which outputs an output signal that is inverted with respect to the input signal and which is further electrically connected to the second pre-charge device 342. This inverting sense amplifier 320 can comprise, for example, a source follower sense amplifier (also referred to as a common drain sense amplifier) (see detailed discussion of FIG. 4 above), a Schmitt trigger comparator (see detailed discussion of FIG. 5 above) or any other suitable inverting sense amplifier.

The second pre-charge device 342 can be electrically to the first power supply 351 (e.g., a positive power supply), the second node 362 and, as mentioned above, the output 322 of the sense amplifier 320. This second pre-charge device 342 can be controlled by a combination of the pre-charge enable signal 349 and the output signal at the output 322 of the sense amplifier 320.

Figure 7:
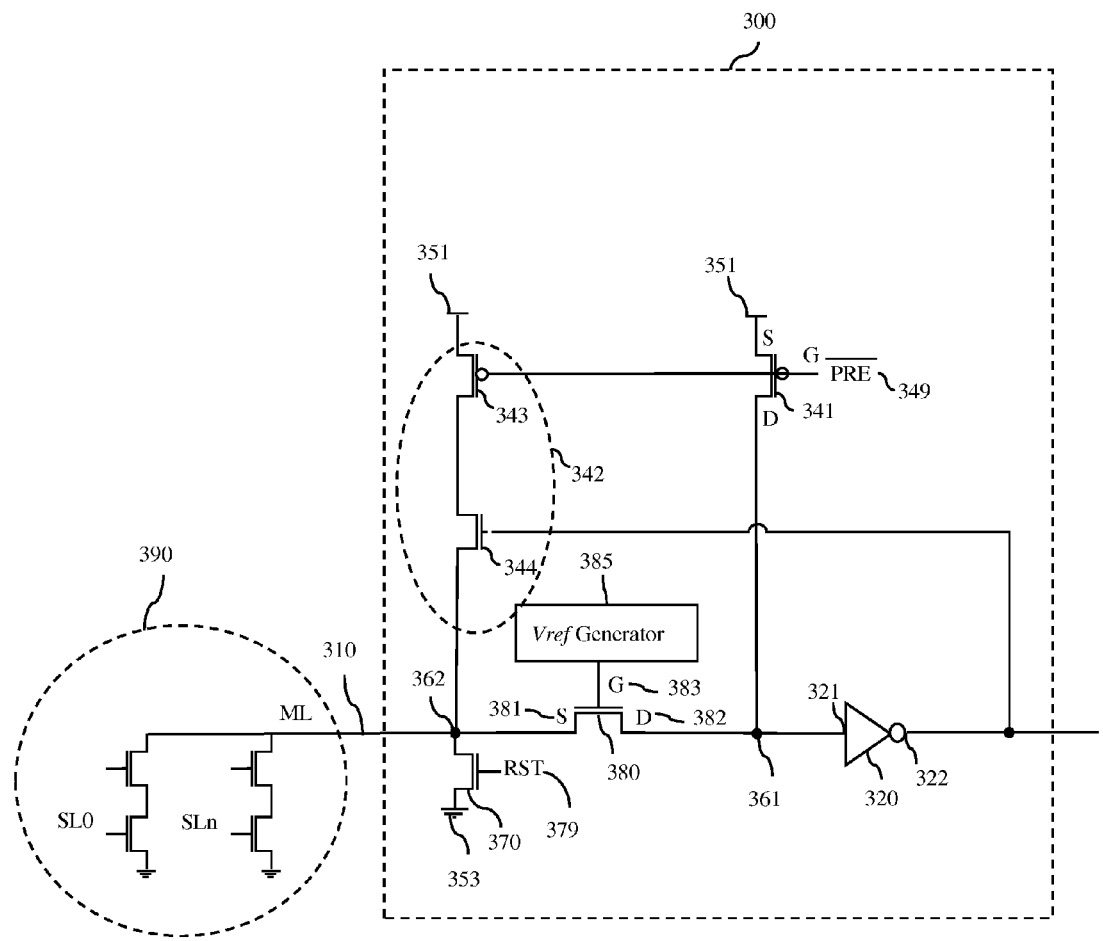
FIG. 7 is a schematic drawing illustrating the single-ended sensing circuit of FIG. 6 and further detailing one type of second pre-charge device that can be incorporated therein.

For example, as illustrated in FIG. 7, the second pre-charge device 342 can comprise a p-type field effect transistor (PFET) 343 and an n-type field effect transistor (NFET) 344 electrically connected in series between the first power supply 351 (e.g., a positive power supply) and the second node 362. The pre-charge enable signal 349 can control the PFET 343 (i.e., a LOW or HIGH pre-charge enable signal can be applied to the gate of the PFET 343 to turn that PFET 343 on or off, respectively) and the output signal from the output 322 of the sense amplifier can control the NFET 344 (i.e., a HIGH or LOW output signal can be applied to the gate of the NFET 344 to turn that NFET 344 on or off, respectively).

Figure 8:
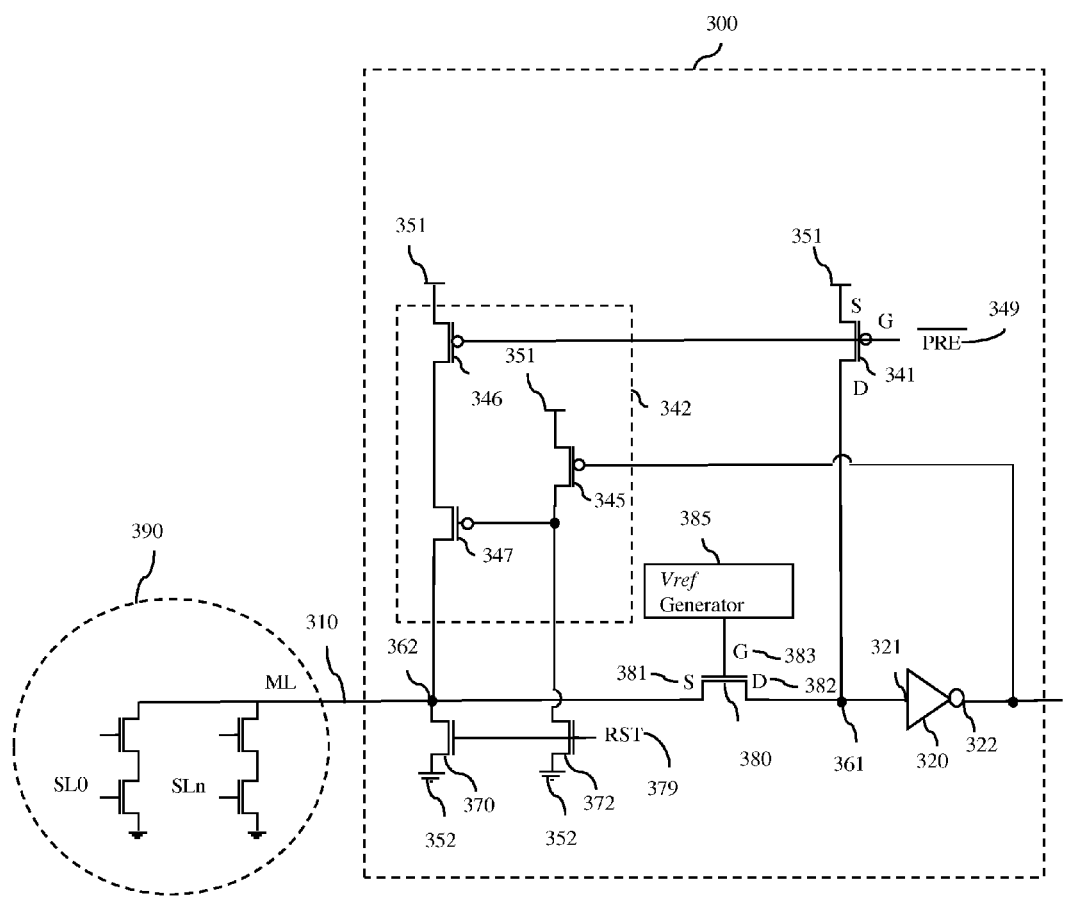
FIG. 8 is a schematic drawing illustrating the single-ended sensing circuit of FIG. 6 and further detailing another type of second pre-charge device that can be incorporated therein.

Alternatively, as illustrated in FIG. 8, the second pre-charge device 342 can comprise a pair of series connected p-type field effect transistors (PFETs) (i.e., a first PFET 346 and a second PFET 347) electrically connected in series between the first power supply 351 (e.g., a positive power supply) and the second node 362. This second pre-charge device 342 can further comprise a third PFET 345, which is electrically connected in series between the first power supply 351 (e.g., a positive power supply) and the gate of the second PFET 347. Additionally, the gate of the third PFET 345 can be electrically connected to the output 322 of the sense amplifier 320. In this case, the output signal from the output 322 of the sense amplifier 320 can control the third PFET 345 (i.e., a LOW or HIGH output signal can be applied to the gate of the third PFET 345 to turn that third PFET 345 on or off, respectively) and the drain voltage of the third PFET 345 can control the second PFET 347 (i.e., a LOW or HIGH drain voltage can be applied to the gate of the second PFET 347 to turn that second PFET 347 on or off, respectively).

In any case, the reference voltage generator 385 can, as mentioned above, be electrically connected to the gate 383 of the isolation FET 380 and can generate and output (i.e., can be adapted to generate and output, can be configured to generate and output, etc.) a reference voltage (Vref) to that gate 383. Multiple different reference voltage generators, which could be incorporated into the sensing circuit 300 disclosed herein, are well known in the art. Thus, the details of such reference voltage generators are omitted from this specification in order to allow the reader to focus on the salient aspects of the disclosed sensing circuit.

The reset device 370 can comprise, for example, an n-type field effect transistor (NFET) comprising a source, a drain and a gate. The reset device 370 can be electrically connected in series between the second power supply 352 (e.g., ground) and the second node 362. That is, the source of the reset device 370 can be electrically connected to the second power supply 352 and the drain of the reset device 370 can be electrically connected to the second node 362. This reset device 370 can be controlled by a reset enable signal 379 applied to the gate. Such a reset enable signal can be a global reset enable signal output simultaneously to multiple reset devices on multiple sensing circuits within a given circuit (e.g., within a given memory circuit). It should be noted that if the second pre-charge device 342 is configured as illustrated in FIG. 8, an additional reset device 372 can be electrically connected in series between the drain of the third PFET 345 and the second power supply 352 and similarly controlled by the reset enable signal 379.

In operation of the sensing circuit 300, during a reset mode, the reset device 370 can be turned on (e.g., by applying a HIGH reset enable signal 379 to its gate), thereby making the reset device 370 conductive and pulling the second node 362 low (e.g., to ground). With regard to the structure shown in FIG. 8, during this reset mode, the reset device 372 similarly be turned on (e.g., by applying the HIGH reset enable signal 379 to its gate), thereby pulling the drain of the third PFET 345 low (e.g., to ground). Following reset, the reset device(s) 370 and, if applicable, 372 can be turned off (e.g., by applying a LOW reset enable signal 379 to the respective gate(s)) and the sensing circuit 300 can enter into a pre-charging mode followed by a sensing mode.

During the pre-charging mode, the reference voltage generator 385 can apply a reference voltage (Vref) to the gate 383 of the isolation FET 380 and the first and second pre-charge devices 341, 342 can be turned on (e.g., by applying a LOW global pre-charge enable signal 349). As a result, the first node 361 can be pre-charged to a first pre-charge voltage (e.g., Vdd) and the second node 362 can be pre-charged to a second pre-charge voltage that is lower than the first pre-charge voltage. Furthermore, the input signal from the first node 361 to the input 321 of the sense amplifier 320 can become a HIGH input signal and the output signal at the output 322 of the sense amplifier 320 can become a LOW output signal.

It should be noted that, during this pre-charging mode, the isolation FET 380 will initially be turned on because the voltage on the gate 383 (Vg) of the isolation FET 380 minus the voltage on the source 381 (VS) of the isolation FET 380 (which is reset to zero during the reset mode) (i.e., Vgs) will be greater than the first threshold voltage of that isolation FET 380. Thus, the first node 361 and second node 362 will initially pre-charge at the same relatively fast rate. However, when the voltage on the second node 362 reaches a value that results in Vgs being equal to or below the first threshold voltage of the isolation FET 380 (i.e., Vgs≤Vt), the isolation FET 380 will turn off (i.e., will become non-conductive). When the isolation FET 380 turns off, the first node 361 will continue to pre-charge to the first pre-charge voltage (e.g., to Vdd) at an even faster rate because all the charge is kept on the first node 361 (i.e., because the first and second nodes become isolated from each other).

As mentioned above, once the first node 361 is pre-charged to the first pre-charge voltage (e.g., Vdd), the output 322 of the sense amplifier 320 will switch to a LOW output signal. This LOW output signal will cause the second pre-charge device 342 to automatically turn off (i.e., to stop pre-charging the second node 362). Specifically, as mentioned above, in the sensing circuit 300, the output 322 of the sense amplifier 320 can be electrically connected to the second pre-charge device 342, as shown in FIG. 7 or in FIG. 8, such that, during the pre-charging mode when the output signal at the output 322 of the sense amplifier 320 switches low (i.e., becomes a LOW output signal), the second pre-charge device 342 will automatically turn off. For example, referring to FIG. 7, the output 322 of the sense amplifier 320 can be electrically connected to the gate of the NFET 344 such that, when the output 322 switches to a LOW output signal, the NFET 344 will become non-conductive and stop any pre-charging of the second node 362. Alternatively, referring to FIG. 8, the output 322 of the sense amplifier 320 can be electrically connected to the gate of the third PFET 345 such that, when the output 322 switches to a LOW output signal, the third PFET 345 will become conductive, the drain of the third PFET 345 will go high and, thereby turn off the gate of the second PFET 347 and stop any pre-charging of the second node 362. It should be noted that the second pre-charge device 342 described above and illustrated in FIG. 8 is optimal for use if loop instability is a concern.

Consequently, a second pre-charge device 342 on the second node 362 can be used so that a relatively fast pre-charge of the second node 362 can be achieved and, particularly, so that the second node 362 can be pre-charged to the desired second pre-charge voltage within a desired amount of time.

During the sensing mode, the reference voltage generator 385 can similarly apply the reference voltage (Vref) to the gate 383 of the isolation FET 380. Then, the sense amplifier 320 can sense a voltage decrease at the first node 361 when/if a corresponding voltage decrease occurs at the second node 362 and, particularly, when/if the voltage on the second node 362 decreases from the second pre-charge voltage to below the reference voltage (Vref) minus the first threshold voltage of the isolation FET 380. Specifically, if no voltage decrease is sensed at the first node 361, the output signal at the output 322 of the sense amplifier 320 will remain a LOW output signal. However, upon sensing a voltage decrease at the first node 361, the sense amplifier 320 can switch the LOW output signal to a HIGH output signal.

It should be noted that the reference voltage (Vref) can be pre-selected so that a relatively fast and accurate sensing of the first node 361 can be achieved. For example, the reference voltage (Vref) can be pre-selected such that the second threshold voltage of the sense amplifier 320 is greater than the reference voltage (Vref) minus the first threshold voltage of the isolation FET 380. Thus, a voltage decrease at the first node 361 to an actual voltage that is below the second threshold voltage of the sense amplifier 320 will occur relatively quickly following a corresponding voltage decrease at the second node 362, thereby causing the sense amplifier 320 to switch the output signal at the output 322 from the LOW output signal to a HIGH output signal within a desired amount of time.

The above-described sensing circuit 300 introduces hysteresis by using multiple pre-charge devices to pre-charge the first node 361 and second node 362 during the pre-charge mode and a relatively low reference voltage (Vref) during the sensing mode in order to provide both fast pre-charge and fast sense, respectively.

Figure 9:
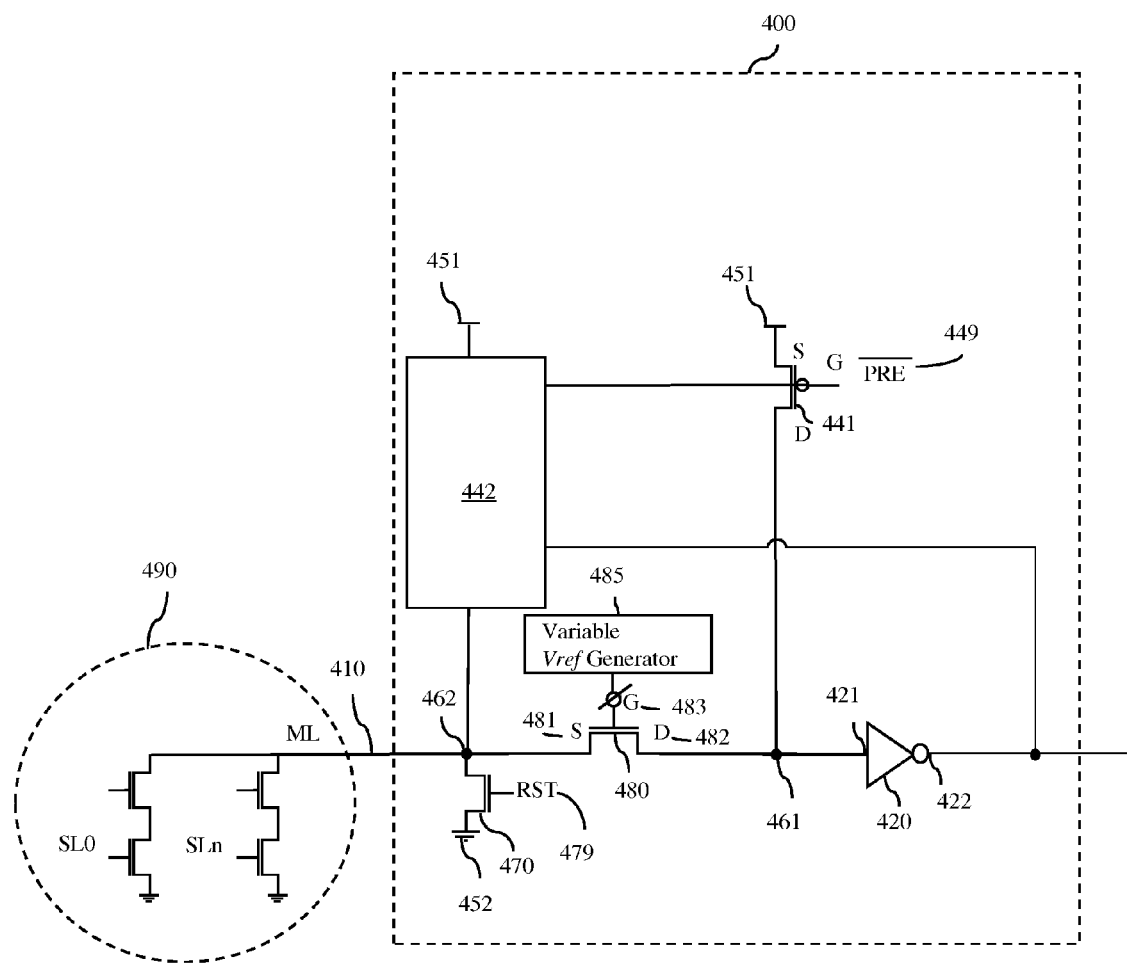
FIG. 9 is a schematic drawing illustrating a single-ended sensing circuit incorporating a variable reference voltage generator, a first pre-charge device and a second pre-charge device.
Figure 10:
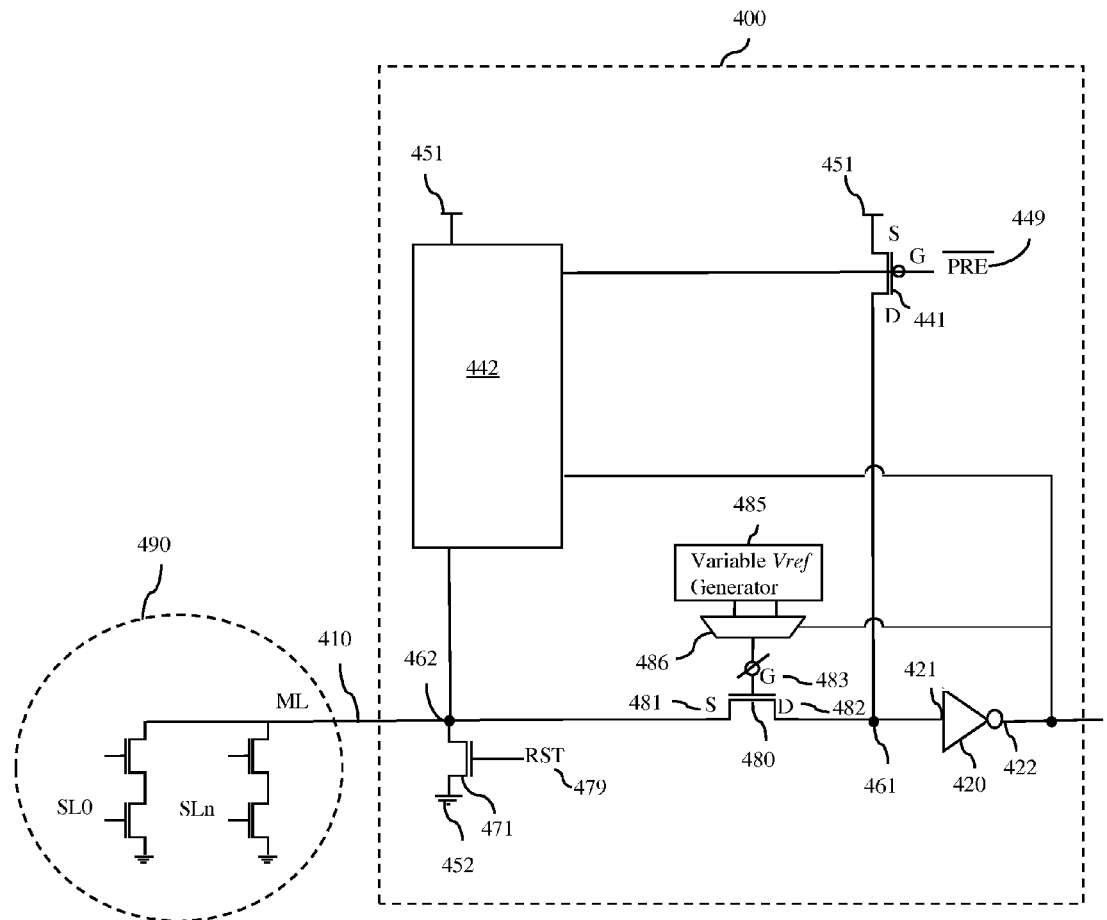
FIG. 10 is a schematic drawing illustrating a single-ended sensing circuit, such as that shown in FIG. 9, further incorporating a multiplexer.

FIGS. 9 and 10 are schematic drawings illustrating alternatively embodiments of yet another single-ended sensing circuit 400 configured to sense a signal value and, particularly, a small signal value on a signal line 410. This sensing circuit 400 combines the features of the sensing circuits 200 and 300 described in detail above. Specifically, this sensing circuit 400 can comprise at least a first node 461 (i.e., a sense node), a second node 462 (i.e., a signal line node), an isolation field effect transistor (FET) 480 having a first threshold voltage, a variable reference voltage generator 485, a first pre-charge device 441, a second pre-charge device 442, a sense amplifier 420 having a second threshold voltage, and at least one reset device.

Specifically, a signal line 410 can be electrically connected to the second node 462. For purposes of illustration, this signal line 410 is shown as a match line connected to comparison logic 490 of a content addressable memory (CAM) circuit. It should be understood that, alternatively, this signal line 410 could comprise a bit line of a dynamic random access memory (DRAM) circuit, a bit line of a static random access memory (SRAM) circuit, or any other type of signal line, which requires sensing by a sense amplifier.

The isolation FET 480 can comprise, for example, an n-type field effect transistor (NFET) comprising a source 481, a drain 482, and a gate 483. The isolation FET 480 can be electrically connected in series between the second node 462 and the first node 461. That is, the source 481 of the isolation FET 480 can be electrically connected to the second node 462 and drain 482 of the isolation FET 480 can be electrically connected to the first node 461. Additionally, the gate 483 of the isolation FET 480 can be electrically connected to the variable reference voltage generator 485.

The first pre-charge device 441 can comprise, for example, a p-type field effect transistor (PFET) comprising a source, a drain and a gate. The first pre-charge device 441 can be electrically connected in series between a first power supply 451 (e.g., a positive power supply) and the first node 461. That is, the source of the first pre-charge device 441 can be electrically connected to the first power supply 451 and the drain of the first pre-charge device 441 can be electrically connected to the first node 461. This first pre-charge device 441 can be controlled by a pre-charge enable signal 449 applied to the gate. Such a pre-charge enable signal 449 can be a global pre-charge enable signal applied simultaneously to multiple pre-charge devices on multiple sensing circuits within a given circuit (e.g., within a given memory circuit).

The sense amplifier 420 can comprise an inverting sense amplifier. Specifically, this sense amplifier 420 can comprise an input 421, which receives an input signal from the first node 461, and an output 422, which outputs an output signal that is inverted with respect to the input signal and which is electrically connected to the second pre-charge device 442. This inverting sense amplifier 420 can comprise, for example, a source follower sense amplifier (also referred to as a common drain sense amplifier) (see detailed discussion of FIG. 4 above), a Schmitt trigger comparator (see detailed discussion of FIG. 5 above) or any other suitable inverting sense amplifier.

The second pre-charge device 442 can be electrically to the first power supply 451 (e.g., a positive power supply), the second node 462 and, as mentioned above, the output 422 of the sense amplifier 420. This second pre-charge device 442 can be controlled by a combination of the pre-charge enable signal 449 and the output signal at the output 422 of the sense amplifier 420.

Figure 11:
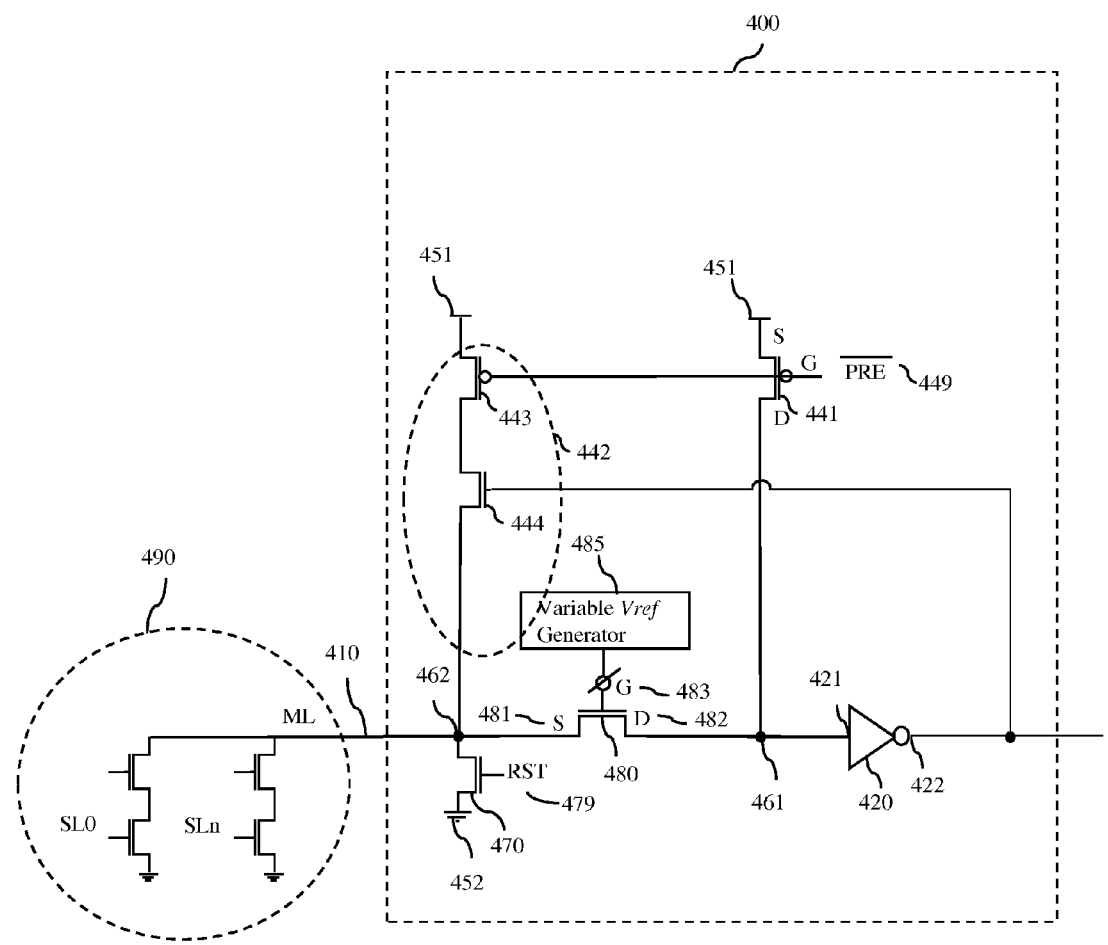
FIG. 11 is a schematic drawing of the single-ended sensing circuit of claim 9 and further detailing one type of second pre-charge device that can be incorporated therein; and, FIG. 12 is a schematic drawing illustrating the single-ended sensing circuit of FIG. 10 and further detailing another type of second pre-charge device that can be incorporated therein.

For example, as illustrated in FIG. 11, the second pre-charge device 442 can comprise a p-type field effect transistor (PFET) 443 and an n-type field effect transistor (NFET) 444 electrically connected in series between the first power supply 451 (e.g., a positive power supply) and the second node 462. The pre-charge enable signal 449 can control the PFET 443 (i.e., a LOW or HIGH pre-charge enable signal can be applied to the gate of the PFET 443 to turn that PFET 443 on or off, respectively) and the output signal from the output 422 of the sense amplifier can control the NFET 444 (i.e., a HIGH or LOW output signal can be applied to the gate of the NFET 444 to turn that NFET 444 on or off, respectively).

Figure 12:
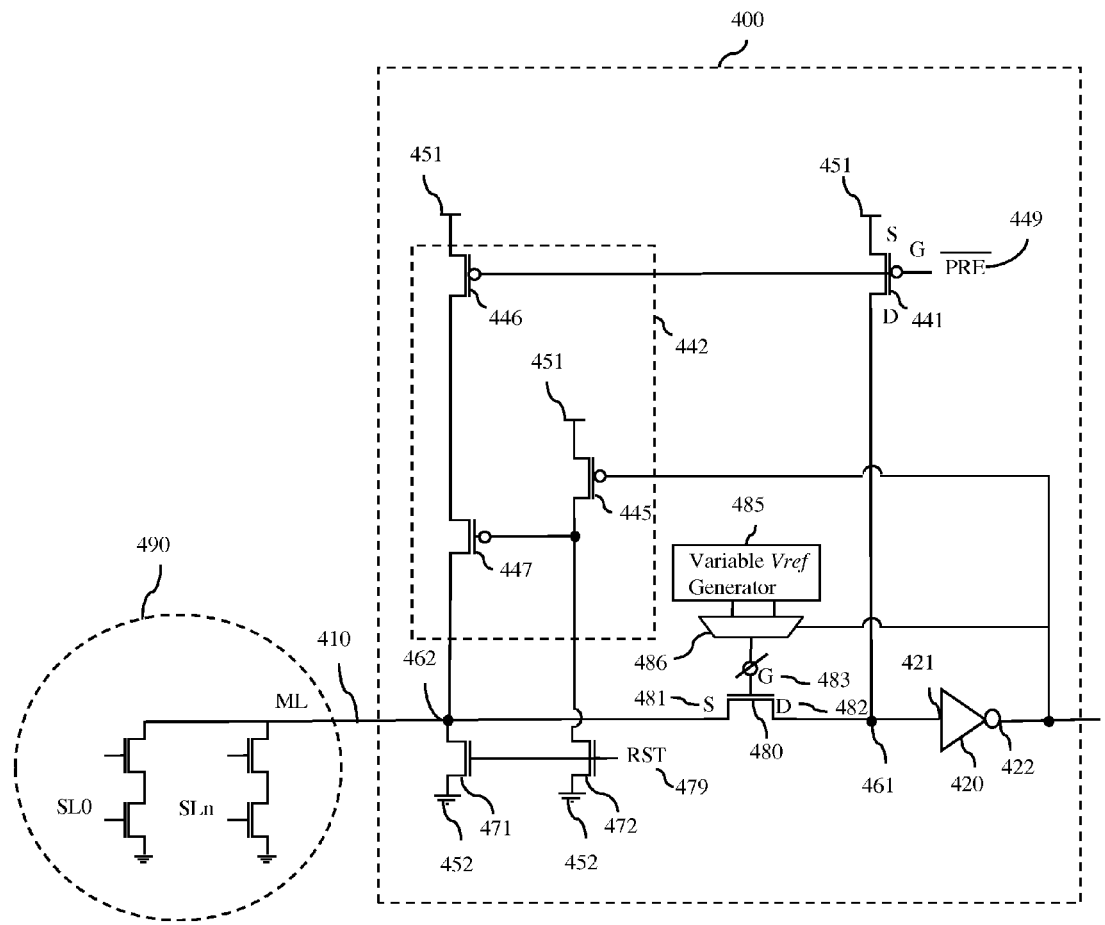

Alternatively, as illustrated in FIG. 12, the second pre-charge device 442 can comprise a pair of series connected p-type field effect transistors (PFETs) (i.e., a first PFET 446 and a second PFET 447) electrically connected in series between the first power supply 451 (e.g., a positive power supply) and the second node 462. This second pre-charge device 442 can further comprise a third PFET 445, which is electrically connected in series between the first power supply 451 (e.g., a positive power supply) and the gate of the second PFET 447. Additionally, the gate of the third PFET 445 can be electrically connected to the output 422 of the sense amplifier 420. In this case, the output signal from the output 422 of the sense amplifier 420 can control the third PFET 445 (i.e., a LOW or HIGH output signal can be applied to the gate of the third PFET 445 to turn that third PFET 445 on or off, respectively) and the drain voltage of the third PFET 445 can control the second PFET 447 (i.e., a LOW or HIGH drain voltage can be applied to the gate of the second PFET 447 to turn that second PFET 447 on or off, respectively).

In any case, the variable reference voltage generator 485 can, as mentioned above, be electrically connected to the gate 483 of the isolation FET 480 and can generate and output (i.e., can be adapted to generate and output, can be configured to generate and output, etc.) at least two different reference voltages to that gate 483. Specifically, the variable reference voltage generator 485 can generate a first reference voltage (Vref1) (e.g., Vdd or some lesser voltage amount) and a second reference voltage (Vref2) that is less than the first reference voltage. Multiple different variable reference voltage generators, which could be incorporated into the sensing circuit 400 disclosed herein, are well known in the art (e.g., see U.S. patent Ser. No. 13/656,829 of Arsovski et al., filed on Oct. 22, 2012, assigned to International Business Machines Corporation and incorporated herein by reference in its entirety). Thus, the details of such variable reference voltage generators are omitted from this specification in order to allow the reader to focus on the salient aspects of the disclosed sensing circuit. In any case, this variable reference voltage generator 485 can be controlled (e.g., by a controller (not shown)) to selectively output either the first reference voltage (Vref1) or the second reference voltage (Vref2), as shown in FIG. 9. Alternatively, the variable reference voltage generator 485 of the sensing circuit 400 can be electrically connected to the gate 483 of the isolation FET 480 through a multiplexer 486, which is also electrically connected to the output 422 of the sense amplifier 420, as shown in FIG. 10. In this case, the variable reference voltage generator 485 can simultaneously output (i.e., can be adapted to simultaneously output, can be configured to simultaneously output, etc.) both the first reference voltage (Vref1) and the second reference voltage (Vref2) and the multiplexer 486 can apply (i.e., can be adapted to apply, can be configured to apply, etc.) either the first reference voltage (Vref1) or the second reference voltage (Vref2) to the gate of the isolation FET 480 depending upon the value of the output signal at the output 422 of the sense amplifier 420, as discussed in greater detail below.

The reset device 470 can comprise, for example, an n-type field effect transistor (NFET) comprising a source, a drain and a gate. The reset device 470 can be electrically connected in series between the second power supply 452 (e.g., ground) and the second node 462. That is, the source of the reset device 470 can be electrically connected to the second power supply 452 and the drain of the reset device 470 can be electrically connected to the second node 462. This reset device 470 can be controlled by a reset enable signal 479 applied to the gate. Such a reset enable signal can be a global reset enable signal output simultaneously to multiple reset devices on multiple sensing circuits within a given circuit (e.g., within a given memory circuit). It should be noted that, if the second pre-charge device 442 is configured as illustrated in FIG. 12, an additional reset device 472 can be electrically connected in series between the drain of the third PFET 445 and the second power supply 452 and similarly controlled by the reset enable signal 479.

In operation of the sensing circuit 400, during a reset mode, the reset device 470 can be turned on (e.g., by applying a HIGH reset enable signal 479 to its gate), thereby making the reset device 470 conductive and pulling the second node 462 low (e.g., to ground). With regard to the structure shown in FIG. 12, during this reset mode, the reset device 472 similarly be turned on (e.g., by applying the HIGH reset enable signal 479 to its gate), thereby pulling the drain of the third PFET 445 low (e.g., to ground). Following reset, the reset device(s) 470 and, if applicable, 472 can be turned off (e.g., by applying a LOW reset enable signal 479 to the respective gate(s)) and the sensing circuit 400 can enter into a pre-charging mode followed by a sensing mode.

During the pre-charging mode, the variable reference voltage generator 485 can apply a first reference voltage (Vref1) to the gate 483 of the isolation FET 480 and both the pre-charge device 441 and the second pre-charge device 442 can be turned on (e.g., by applying a LOW pre-charge enable signal 449). As a result, the first node 461 can be pre-charged to a first pre-charge voltage and the second node 462 can be pre-charged to a second pre-charge voltage that is lower than the first pre-charge voltage. Furthermore, the input signal from the first node 461 at the input 421 to the sense amplifier 420 can become a HIGH input signal and the output signal at the output 422 of the sense amplifier 420 can become a LOW output signal. The first pre-charge voltage on the first node 461 can comprise, for example, Vdd. That is, the pre-charge device 440 can, for example, pull the first node 461 up to Vdd. The second pre-charge voltage on the second node 462 can be approximately equal to the first reference voltage (Vref1) minus the first threshold voltage of the isolation FET 480. That is, the pre-charge operation can be performed so as to pull the second node 462 up to a second pre-charge voltage that approaches the first reference voltage (Vref1) minus the first threshold voltage of the isolation FET 480. For optimal performance, the sensing circuit 400 can be designed such that this second pre-charge voltage is less than the second threshold voltage of the sense amplifier 420.

It should be noted that, during this pre-charging mode, the isolation FET 480 will initially be turned on because the voltage on the gate 483 (Vg) of the isolation FET 480 minus the voltage on the source 481 (VS) of the isolation FET 480 (which is reset to zero during the reset mode) (i.e., Vgs) will be greater than the first threshold voltage of that isolation FET 480. Thus, the first node 461 and second node 462 will initially pre-charge at the same relatively fast rate. However, when the voltage on the second node 462 reaches a value that results in Vgs being equal to or below the first threshold voltage of the isolation FET 480 (i.e., Vgs≤Vt), the isolation FET 480 will turn off (i.e., will become non-conductive). When the isolation FET 480 turns off, the first node 461 will continue to pre-charge the first pre-charge voltage (e.g., Vdd) at an even faster rate because all the charge is kept on the first node 461 (i.e., the first and second nodes are isolated from each other).

As mentioned above, once the first node 461 is pre-charged to the first pre-charge voltage (e.g., to Vdd), the output 422 of the sense amplifier 420 will switch to a LOW output signal. This LOW output signal will cause the second pre-charge device 442 to automatically turn off (i.e., to stop pre-charging the second node 462). Specifically, as mentioned above, in the sensing circuit 400, the output 422 of the sense amplifier 420 can be electrically connected to the second pre-charge device 442, as shown in FIG. 11 or FIG. 12, such that, during the pre-charging mode when the output signal at the output 422 of the sense amplifier 420 switches low (i.e., becomes a LOW output signal), the second pre-charge device 442 will automatically turn off. For example, referring to FIG. 11, the output 422 of the sense amplifier 420 can be electrically connected to the gate of the NFET 444 such that, when the output 422 switches to a LOW output signal, the NFET 444 will become non-conductive and stop any pre-charging of the second node 462. Alternatively, referring to FIG. 12, the output 422 of the sense amplifier 420 can be electrically connected to the gate of the third PFET 445 such that, when the output 422 switches to a LOW output signal, the third PFET 445 will become conductive, the drain of the third PFET 445 will go high and, thereby turn off the gate of the second PFET 447 and stop any pre-charging of the second node 462. It should be noted that the second pre-charge device 442 described above and illustrated in FIG. 12 is optimal for use if loop instability is a concern.

It should further be noted that the rate at which the second node 462 is pre-charged will decrease as the actual voltage on the second node 462 approaches an amount equal to the first reference voltage (Vref1) minus the first threshold voltage of the isolation FET 480. Thus, the higher first reference voltage (Vref1), the faster the desired second pre-charge voltage can be reached at the second node 462. Consequently, the combination of both a relatively high first reference voltage (Vref1) applied to the gate 483 of the isolation FET 480 and a second pre-charge device 442 on the second node 462 can be used so that a relatively fast pre-charge of the second node 462 can be achieved and, particularly, so that the second node 462 can be pre-charged to the desired second pre-charge voltage within a desired amount of time.

During a sensing mode, the variable reference voltage generator 485 can apply the second reference voltage (Vref2), which, as mentioned above, is less than the first reference voltage (Vref2), to the gate 483 of the isolation FET 480. Then, the sense amplifier 420 can sense a voltage decrease at the first node 461 when/if a corresponding voltage decrease occurs at the second node 462 and, particularly, when/if the voltage on the second node 462 decreases from the second pre-charge voltage to below the second reference voltage (Vref2) minus the first threshold voltage of the isolation FET 480. Specifically, if no voltage decrease is sensed at the first node 461, the output signal at the output 422 of the sense amplifier 420 will remain a LOW output signal. However, upon sensing a voltage decrease at the first node 461, the sense amplifier 420 can switch the LOW output signal to a HIGH output signal.

It should be noted that the second reference voltage (Vref2) can be pre-selected so that a relatively fast and accurate sensing of the first node 461 can be achieved. For example, the second reference voltage (Vref2) can be pre-selected such that, as mentioned above, it is less than the first reference voltage (Vref1) and further such that the second threshold voltage of the sense amplifier 420 is greater than the second reference voltage (Vref2) minus the first threshold voltage of the isolation FET 480. Thus, a voltage decrease at the first node 461 to an actual voltage that is below the second threshold voltage of the sense amplifier 420 will occur relatively quickly following a corresponding voltage decrease at the second node 462, thereby causing the sense amplifier 420 to switch the output signal at the output 422 from the LOW output signal to a HIGH output signal within a desired amount of time.

As mentioned above, the variable reference voltage generator 485 can be controlled (e.g., by a controller (not shown)) to selectively output either the first reference voltage (Vref1) or the second reference voltage (Vref2), as shown in FIG. 9. Alternatively, the variable reference voltage generator 485 can be electrically connected to the gate 483 of the isolation FET 480 through a multiplexer 486, which is controlled by the output 422 of the sense amplifier 420. In this case, when the input signal from the first node 461 to the input 421 of the sense amplifier 420 is a LOW input signal and the output signal at the output 422 of the sense amplifier 420 is a HIGH output signal, the multiplexer 486 can selectively and automatically apply (i.e., can be adapted to selectively and automatically apply, can be configured to selectively and automatically apply, etc.) the first reference voltage (Vref1) to the gate 483 of the isolation FET 480. Furthermore, once the first node 461 is pre-charged to the first pre-charge voltage and, thus, the input signal to the input 421 of the sense amplifier is a HIGH input signal and the output signal at the output 422 switches to a LOW output signal, the multiplexer 486 can selectively and automatically apply (i.e., can be adapted to selectively and automatically apply, can be configured to selectively and automatically apply, etc.) the second reference voltage (Vref2) to the gate 483 of the isolation FET 480.

The above-described sensing circuit 400 introduces hysteresis by using a combination of both a relatively high first reference voltage (Vref1) and multiple pre-charged devices to pre-charge the first node 461 and second node 462 during the pre-charge mode and a relatively low second reference voltage (Vref2) during the sensing mode in order to provide both fast pre-charge and fast sense, respectively.

It should be understood that the terminology used herein is for the purpose of describing disclosed devices, circuits and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are single-ended sensing circuits configured for relatively fast pre-charging operations and for relatively fast and accurate sensing operations in order to improve performance. Each of the sensing circuits comprises at least a sense amplifier connected to a first node (i.e., a sense node), an isolation field effect transistor (FET) connected in series between the sense node and a second node (i.e., a signal line node on a signal line), and a pre-charged device connected to the sense node. In order to achieve a relatively fast pre-charge of both the sense and signal line nodes and to also achieve a relatively fast and accurate sense of the sense node, the single-ended circuits further incorporate a variable reference voltage generator connected to the gate of the isolation FET for selectively applying different reference voltages to the gate during pre-charging and sensing operations, respectively, and/or a second pre-charge device connected to the signal line node for facilitating pre-charging of that signal line node. Specifically, one sensing circuit achieves a fast pre-charge by turning on a pre-charge device connected to the first node and applying a relatively high first reference voltage (Vref1) to the gate of the isolation FET, thereby pre-charging the first node to a first pre-charge voltage (e.g., Vdd) and the second node to a second, lesser, pre-charge voltage. This same sensing circuit achieves a relatively fast sense by applying a second, lesser, reference voltage (Vref2) to the gate of the isolation FET when sensing the voltage on the sense node. Another sensing circuit achieves a relatively fast pre-charge by turning on parallel pre-charge devices connected to the first and second nodes, thereby pre-charging the first node to a first pre-charge voltage (e.g., Vdd) and the second node to a second, lesser, pre-charge voltage. This same sensing circuit achieves a relatively fast sense by applying a relatively low reference voltage (Vref) to the gate of the isolation FET during the sense operation. Yet another sensing circuit combines the features of these two sensing circuits.

What is claimed is:

1. A sensing circuit comprising:
a first node;
a second node electrically connected to a signal line;
an isolation field effect transistor comprising a source electrically connected to said second node, a drain electrically connected to said first node, and a gate;
a variable reference voltage generator electrically connected to said gate;
a pre-charge device electrically connected to said first node; and
a sense amplifier comprising:
an input receiving an input signal from said first node; and
an output outputting an output signal,
said variable reference voltage generator applying a first reference voltage to said gate and said pre-charge device turning on, during a pre-charging mode, such that said first node is pre-charged to a first pre-charge voltage, said second node is pre-charged to a second pre-charge voltage that is lower than said first pre-charge voltage, said input signal becomes a HIGH input signal and said output signal becomes a LOW output signal, and
said variable reference voltage generator applying a second reference voltage that is less than said first reference voltage to said gate, during a sensing mode, such that, upon sensing a voltage decrease at said first node, said sense amplifier switches said LOW output signal to a HIGH output signal.

2. The sensing circuit of claim 1, said second pre-charge voltage being approximately said first reference voltage minus a first threshold voltage of said isolation field effect transistor and further being less than a second threshold voltage of said sense amplifier.

3. The sensing circuit of claim 2, said sense amplifier sensing said voltage decrease at said first node as a corresponding voltage decrease occurs at said second node from said second pre-charge voltage to below said second reference voltage minus said first threshold voltage.

4. The sensing circuit of claim 1, said sense amplifier comprising any one of a source follower and a Schmitt trigger comparator.

5. The sensing circuit of claim 1, further comprising a reset device electrically connected to said second node, said reset device being turned off, during said sensing mode and said pre-charging mode, and said reset device being turned on, during a reset mode, to pull said second node to ground.

6. The sensing circuit of claim 1, further comprising a multiplexer receiving said first reference voltage and said second reference voltage from said variable reference voltage generator, receiving said output signal from said output, applying said first reference voltage to said gate when said output signal is said HIGH output signal, and applying said second reference voltage to said gate when said output signal is said LOW output signal.

7. A sensing circuit comprising:
a first node;
a second node electrically connected to a signal line;
an isolation field effect transistor comprising a source electrically connected to said second node, a drain electrically connected to said first node, and a gate;
a reference voltage generator electrically connected to said gate;
a first pre-charge device electrically connected to said first node;
a second pre-charge device electrically connected to said second node; and
a sense amplifier comprising:
an input receiving an input signal from said first node; and
an output outputting an output signal,
said output being electrically connected to said second pre-charge device,
said reference voltage generator applying a reference voltage to said gate and said first pre-charge device and said second pre-charge device each turning on, during a pre-charging mode, such that said first node is pre-charged to a first pre-charge voltage, said second node is pre-charged to a second pre-charge voltage that is lower than said first pre-charge voltage, said input signal becomes a HIGH input signal and said output signal becomes a LOW output signal, said second pre-charge device automatically turning off, during said pre-charging mode, when said output signal at said output becomes said LOW output signal, and said reference voltage generator applying said reference voltage to said gate, during a sensing mode, such that, upon sensing a voltage decrease at said first node, said sense amplifier switches said LOW output signal to a HIGH output signal.

8. The sensing circuit of claim 7, said second pre-charge voltage being approximately said reference voltage minus a first threshold voltage of said isolation field effect transistor and further being less than a second threshold voltage of said sense amplifier.

9. The sensing circuit of claim 8, said sense amplifier sensing said voltage decrease at said first node as a corresponding voltage decrease occurs at said second node from said second pre-charge voltage to below said reference voltage minus said first threshold voltage.

10. The sensing circuit of claim 8, said second pre-charge device comprising: a p-type field effect transistor and an n-type field effect transistor electrically connected in series between a power supply and said second node, said output of said sense amplifier controlling said n-type field effect transistor.

11. The sensing circuit of claim 8, said second pre-charge device comprising:
a first p-type field effect transistor and a second p-type field effect transistor electrically connected in series between a power supply and said second node; and
a third p-type field effect transistor electrically connected to said power supply, said output of said sense amplifier controlling said third p-type field effect transistor and a drain voltage of said third p-type field effect transistor controlling said second p-type field effect transistor.

12. The sensing circuit of claim 8, said sense amplifier comprising any one of a source follower and a Schmitt trigger comparator.

13. The sensing circuit of claim 8, further comprising a reset device electrically connected to said second node, said reset device being turned off, during said sensing mode and said pre-charging mode, and said reset device being turned on, during a reset mode, to pull said second node to ground.

14. A sensing circuit comprising:
a first node;
a second node electrically connected to a signal line;
an isolation field effect transistor comprising a source electrically connected to said second node, a drain electrically connected to said first node, and a gate;
a variable reference voltage generator electrically connected to said gate;
a first pre-charge device electrically connected to said first node;
a second pre-charge device electrically connected to said second node; and
a sense amplifier comprising:
an input receiving an input signal from said first node; and
an output outputting an output signal,
said output being electrically connected to said second pre-charge device,
said variable reference voltage generator applying a first reference voltage to said gate and said first pre-charge device and said second pre-charge device each turning on, during a pre-charging mode, such that said first node is pre-charged to a first pre-charge voltage, said second node is pre-charged to a second pre-charge voltage that is lower than said first pre-charge voltage, said input signal becomes a HIGH input signal and said output signal becomes a LOW output signal, said second pre-charge device automatically turning off, during said pre-charging mode, when said output signal at said output becomes said LOW output signal, and said variable reference voltage generator applying a second reference voltage that is less than said first reference voltage to said gate, during a sensing mode, such that, upon sensing a voltage decrease at said first node, said sense amplifier switches said LOW output signal to a HIGH output signal.

15. The sensing circuit of claim 14, said second pre-charge voltage being approximately said first reference voltage minus a first threshold voltage of said isolation field effect transistor and further being less than a second threshold voltage of said sense amplifier.

16. The sensing circuit of claim 15, said sense amplifier sensing said voltage decrease at said first node as a corresponding voltage decrease occurs at said second node from said second pre-charge voltage to below said second reference voltage minus said first threshold voltage.

17. The sensing circuit of claim 14, said second pre-charge device comprising: a p-type field effect transistor and an n-type field effect transistor electrically connected in series between a power supply and said second node, said output of said sense amplifier controlling said n-type field effect transistor.

18. The sensing circuit of claim 14, said second pre-charge device comprising:
a first p-type field effect transistor and a second p-type field effect transistor electrically connected in series between a power supply and said second node; and
a third p-type field effect transistor electrically connected to said power supply, said output of said sense amplifier controlling said third p-type field effect transistor and a drain voltage of said third p-type field effect transistor controlling said second p-type field effect transistor.

19. The sensing circuit of claim 14, said sense amplifier comprising any one of a source follower and a Schmitt trigger comparator.

20. The sensing circuit of claim 14, further comprising at least one of the following:
a reset device electrically connected to said second node, said reset device being turned off, during said sensing mode and said pre-charging mode, and said reset device being turned on, during a reset mode, to pull said second node to ground; and
a multiplexer receiving said first reference voltage and said second reference voltage from said variable reference voltage generator, receiving said output signal from said output, applying said first reference voltage to said gate when said output signal is said HIGH output signal, and applying said second reference voltage to said gate when said output signal is said LOW output signal.

* * * * *